United States Patent
Sawaya

[11] Patent Number: 6,060,952
[45] Date of Patent: May 9, 2000

[54] AMPLIFIER CIRCUIT FOR INFRARED SENSOR

[75] Inventor: Kazuyuki Sawaya, Hamamatsu, Japan

[73] Assignee: Atsumi Electric Co., Ltd., Hamamatsu, Japan

[21] Appl. No.: 09/259,683

[22] Filed: Mar. 1, 1999

[30] Foreign Application Priority Data

Nov. 2, 1998 [JP] Japan .................................. 10-312474

[51] Int. Cl.[7] ...................................................... H03F 3/08
[52] U.S. Cl. ........................................... 330/308; 330/310
[58] Field of Search .................................. 330/150, 302, 330/308, 310; 250/214 A

[56] References Cited

U.S. PATENT DOCUMENTS

| | | | |
|---|---|---|---|
| 4,232,272 | 11/1980 | Fabri ......................................... | 330/294 |
| 4,593,250 | 6/1986 | Lucas et al. .............................. | 330/107 |
| 5,006,814 | 4/1991 | Wilson .................................... | 330/107 |
| 5,942,946 | 8/1999 | Su et al. ................................... | 330/310 |

*Primary Examiner*—Robert Pascal
*Assistant Examiner*—Henry Choe
*Attorney, Agent, or Firm*—Armstrong, Westerman, Hattori, McLeland & Naughton

[57] ABSTRACT

The present invention aims to avoid mutual interference of outputs of passive infrared detectors in an amplifier circuit of an infrared sensor to be amplified by a single system of amplifier circuit by cyclically switching outputs from a plurality of passive infrared detectors at a predetermined cycle. $P_1$ and $P_2$ each represents a passive infrared detector, and switches $2_1$ and $2_2$ can be switched over cyclically. Between an operational amplifier 12 and an operational amplifier 13, series circuits of capacitors and switches are provided in parallel as many as the passive infrared detectors. Switches $20_1$ and $20_2$ are opened and closed in synchronization with the switches $2_1$ and $2_2$ respectively. The capacitor $C_{30}$ is used when an output from the passive infrared detector $P_1$ is amplified, and a capacitor $C_{31}$ is used when an output from the passive infrared detector $P_2$ is amplified. Thus, it is possible to avoid the interference of the outputs of the passive infrared detectors $P_1$ and $P_2$ with each other.

1 Claim, 5 Drawing Sheets

AMPLIFIER CIRCUIT FOR INFRARED SENSOR

BACKGROUND OF THE INVENTION

The present invention relates to a signal processing circuit for an infrared sensor, and in particular, to a signal processing circuit suitable for an infrared sensor which has a plurality of passive infrared detectors.

The present applicant previously proposed in the Japanese Patent Application 7-271175 (Japanese Patent Publication Laid-Open 9-115064) a signal processing circuit suitable for an infrared sensor which has a plurality of passive infrared detectors. It is briefly described as follows:

FIG. 2 is a diagram showing an arrangement example in case a signal processing circuit as proposed by the present applicant in the Japanese Patent Application 7-271175 is applied to an infrared sensor using three passive infrared detectors. In this diagram, reference symbols $1_1$, $1_2$ and $1_3$ each represents a passive infrared detector, $2_1$, $2_2$ and $2_3$ each represents a switch, 3 represents a signal amplifying unit, and 4 a control unit.

Each of the three passive infrared detectors $1_1$, $1_2$ and $1_3$ comprises a pyroelectric element as an infrared detection element and an amplifier such as FET. As the infrared detection element, a pyroelectric element may be used, or as shown in FIG. 3, a so-called twin type element may be used where two pyroelectric elements having positive polarity and negative polarity respectively are connected in series.

One end of each of the switches $2_1$, $2_2$ and $2_3$ is connected to each of the passive infrared detectors $1_1$, $1_2$ and $1_3$ respectively, and the other end is connected to the signal amplifying unit 3. The switches $2_1$, $2_2$ and $2_3$ are actually designed as electronic switches using transistor or the like. In FIG. 2, a symbol of the mechanical switch is used for convenience.

As shown in FIG. 4, the signal amplifying unit 3 comprises a filter 5 and two amplifier circuits 6 and 7. The filter 5 is designed as the so-called CR type band-pass filter, comprising a capacitor and a resistance, and the value of each of C and R is set in such manner that it allows to pass frequency component of about 0.3 to 2 Hz as shown in FIG. 5, for example. The frequency domain is a frequency domain of signals outputted from the passive infrared detectors $1_1$, $1_2$ and $1_3$ in case a person is moving at a normal speed.

The amplifier circuits 6 and 7 normally comprise operational amplifiers. The amplifier circuits in two stages are used because output signals from the passive infrared detectors $1_1$, $1_2$ and $1_3$ are very small, and it is necessary to amplify these signals by about 10,000 times in stable manner and with good S/N.

The control unit 4 incorporates or receives the output signal of the signal amplifying unit 3. In case the incorporated signal exceeds a predetermined threshold, it is judged that a person has intruded, and an alarm signal is issued to indicate that there is an intruder, and opening and closing of the switches $2_1$, $2_2$ and $2_3$ are controlled by a control signal.

In the arrangement as shown in FIG. 2, the control unit 4 turns the switches $2_1$, $2_2$ and $2_3$ on or off cyclically at a predetermined cycle according to control signals shown in FIGS. 6 (a), (b) and (c). FIG. 6 (a) shows a control signal to correspond to the switch $2_1$, FIG. 6 (b) shows a control signal to correspond to the switch $2_2$, and FIG. 6 (c) shows a control signal to correspond to the switch $2_3$. In FIGS. 6 (a), (b) and (c), time is represented on the abscissa. When the control signal is at high level, the switch is closed, and during the period when the switch is closed, the output signal of the passive infrared detector connected to the switch is inputted to the signal amplifying unit 3 via the switch.

Here, the time $t_c$, during which the switches $2_1$, $2_2$ and $2_3$ are closed, may be about 5 to 10 msec. Also, the on/off period $t_s$ varies naturally according to the number of the passive infrared detectors to be connected, and it should be limited to about 1 sec. at the maximum.

According to the operating procedure, output signals of the passive infrared detectors $1_1$, $1_2$ and $1_3$ are inputted to the signal amplifying unit 3 sequentially via the switches $2_1$, $2_2$ and $2_3$ and these are compared with the threshold value at the control unit 4. In case the input signal exceeds the threshold value, the control unit 4 issues an alarm signal.

With the arrangement as described above, in the signal processing circuit of the infrared sensor, outputs from a plurality of the passive infrared detectors are switched over cyclically and are amplified by a single system of amplifier circuit. As a result, even when the number of the passive infrared detectors 1 is increased, there is no need to increase the signal amplifying unit 3, and only the switch 2 should be increased. This makes it possible to minimize the scale of the circuit.

According to the signal processing circuit of the infrared sensor, output signal of each passive infrared detector is regularly sampled. Even when external noise may be intermingled, it is very unlikely that the external noise is sampled and inputted to the signal amplifying unit 3. Thus, adverse effect of the external noise can be neglected, and this improves noise resistant property.

In the above, description has been given on a signal processing circuit of infrared sensor as proposed in the Japanese Patent Application 7-271175 filed by the present applicant. Further, the present applicant has proposed an amplifier circuit for amplifying the output signal from passive infrared detectors of infrared sensor in the Japanese Patent Application 8-237589 (Japanese Patent Publication Laid-Open 10-83488). It is briefly described as follows:

FIG. 7 is a diagram showing an arrangement example of an amplifier circuit as proposed in the above Japanese Patent Application 8-237589. In the figure, reference symbol P represents a passive infrared detector, 10 a pyroelectric element serving as an infrared detection element, 11 represents a FET, and 12, 13 and 14 each represents an operational amplifier with one-side power source.

The pyroelectric element 10 is typically the so-called twin element, while it may be designed otherwise. The output signal of the pyroelectric element 10 is amplified by the FET 11 and is outputted to both ends of a load resistance $R_1$. To this output signal, bias voltage $V_{B1}$ is applied by the load resistance $R_1$. The bias voltage $V_{B1}$ is normally about 0.6 to 1.2 V.

An operational amplifier 14 and resistance $R_{15}$ and $R_{16}$ constitute a bias voltage generating circuit. Bias voltage $V_{BO}$ generated by the bias voltage generating circuit is set to a central voltage within the range of output voltage of the operational amplifiers 12 and 13.

The output signal of the FET 11 is inputted to a non-inverting input terminal of the operational amplifier 12, serving as a primary stage amplifier, via HPF which is constituted by a capacitor $C_{11}$ and a resistance $R_{11}$. This HPF constituted by the capacitor $C_{11}$ and the resistance $R_{11}$ determines cutoff frequency $f_{CL}$ on low frequency side of band characteristics, and the low frequency side cutoff frequency $f_{CL}$ is determined by a time constant $R_{11} \times C_{11}$.

Therefore, DC component of the output signal of the FET 11 is cut by the capacitor $C_{11}$. On the other end of the resistance $R_{11}$, a bias voltage $V_{BO}$ from the bias voltage generating circuit is applied. As a result, the signal inputted to the non-inverting input terminal of the operational amplifier 12, which is serving as the primary stage amplifier, is amplified around the bias voltage $V_{BO}$.

Amplification factor of the operational amplifier 12 is determined by $R_{12}/R_{17}$. The resistance $R_{12}$ and the capacitor $C_{12}$ constitute a filter to determine cutoff frequency $f_{CH}$ on high frequency side of band characteristics, and the high frequency side cutoff frequency $f_{CH}$ is determined by a time constant $R_{12} \times C_{12}$.

With the arrangement as described above, in the primary stage amplifier of the operational amplifier 12, amplification is performed by a factor of $R_{12}/R_{17}$ with the bias voltage $V_{BO}$ as the central voltage, and the band characteristics are limited to $f_{CL}$–$f_{CH}$.

The output signal of the operational amplifier 12 is inputted to the non-inverting input terminal of the operational amplifier 13, serving as a second stage amplifier, via HPF which is constituted by the capacitor $C_{13}$ and the resistance $R_{13}$. The HPF constituted by the capacitor C13 and the resistance $R_{13}$ determines cutoff frequency on low frequency side of band characteristics, and the low frequency side cutoff frequency is determined by a time constant $R_{13} \times C_{13}$. Here, $R_{11} \times C_{11} = R_{13} \times C_{13}$.

Therefore, DC component of the output signal of the operational amplifier 12 is cut by the capacitor $C_{13}$. On the other end of the resistance $R_{13}$, the bias voltage $V_{BO}$ from the bias voltage generating circuit is applied, and the signal to be inputted to the non-inverting input terminal of the operational amplifier, serving as the second stage amplifier, is amplified with the bias voltage $V_{BO}$ as the central voltage. Amplification factor of the operational amplifier 13 is determined by $R_{14}/R_{18}$. The resistance $R_{14}$ and $C_{14}$ constitute a filter to determine high frequency side cutoff frequency of band characteristics, and the high frequency side cutoff frequency is determined by a time constant $R_{14} \times C_{14}$. Here, $R_{12} \times C_{12} = R_{14} \times C_{14}$.

With the arrangement as described above, amplification is performed in the second stage amplifier by a factor of $R_{14}/R_{18}$ with the bias voltage $V_{BO}$ as the central voltage, and the band characteristics are limited to $f_{CL}$–$f_{CH}$. The output signal $V_{OUT}$ of the operational amplifier 13 may be converted by A/D conversion or may be inputted to a comparator without change, and it is used for the processing of intruder detection.

As described above, the amplifier circuit shown in FIG. 7 is based on a circuit, which comprises a high frequency pass filter to determine cutoff frequency on low frequency side of band characteristics and an amplifier having low pass filter function to amplify output signal of the high pass filter and to determine high frequency side cutoff frequency of band characteristics. These circuits are connected in series in two stages, and a predetermined bias voltage is given to the high pass filter of each set and to all amplifiers from the bias voltage generating circuit.

Therefore, by setting the cutoff frequency on low frequency side of the band characteristics to about 0.3 Hz and the cutoff frequency on high frequency side of the band characteristics to about 2 Hz, it is possible to constitute an amplifier circuit, which has the band characteristics as shown in FIG. 5.

According to the arrangement as shown in FIG. 7, the following effects can be attained:

First, this contributes to compact design of an infrared sensor. Specifically, in the past, it has been necessary to use an electrolytic capacitor with high capacity as the capacitor to determine cutoff frequency on low frequency side of the band characteristics. As a result, this leads to a circuit of larger scale and an infrared sensor of larger size. In case the cutoff frequency on low frequency side of the band characteristics is set to the same value as in the past, i.e. to about 0.3 Hz, and if $R_{11}$=approx. 100 kΩ in the arrangement shown in FIG. 7, then $C_{11}$=approx. 3 μF. This makes it possible to design the capacitor $C_{11}$ in smaller capacity. As a result, the infrared sensor can be designed in compact size. The same applies to the capacitor $C_{13}$, which determines cutoff frequency on low frequency side of band characteristics in the second stage amplifier.

In the arrangement shown in FIG. 7, the HPF constituted by the capacitor $C_{11}$ and the resistance $R_{11}$ is not related to the amplification factor of the operational amplifier 12. Thus, the capacity of the capacitor $C_{11}$ and the resistance value of the resistance $R_{11}$ can be determined by considering only the low frequency side cutoff frequency of the band characteristics, and there is a degree of freedom in the setting of these values. The same applies to the HPF which is constituted by the capacitor $C_{13}$ and the resistance $R_{13}$.

Further, in the circuit of FIG. 7, the time for warming up can be made shorter than in the conventional system. This can be explained as follows:

When power is turned on in the circuit of FIG. 7, the bias voltage $V_{BO}$ from the bias voltage generating circuit is applied on the inverting input terminal and the non-inverting input terminal of the operational amplifier 12 and to the inverting input terminal and the non-inverting input terminal of the operational amplifier 13. As a result, the operational amplifiers 12 and 13 can be operated immediately after power is turned on. However, the capacitor is not electrically charged immediately after the connection of power, and the signal is not transmitted. That is, in the circuit configuration shown in FIG. 7, the time from the power connection to the time when the capacitor $C_{11}$ is electrically charged to a predetermined value is defined as the time for warming up.

In the past, the electrolytic capacitor is used in the amplifier circuit as described above, and the time from the power connection to the time when the electrolytic capacitor is electrically charged is the time for warming up, and some time is required until the electrolytic capacitor will be electrically charged. In the circuit of FIG. 7, however, charging current to charge the capacitor $C_{11}$ flows from the bias voltage generating circuit to the capacitor $C_{11}$ via the resistance $R_{11}$. As described above, the capacity of the capacitor $C_{11}$ is low and the resistance value of the resistance $R_{11}$ is in the order of several hundreds of kΩ at the highest. Thus, the time for warming up is shorter.

As described above, when an amplifier circuit marked by one-dot chain line as shown by A in FIG. 7 is used as the signal amplifying unit 3 in the arrangement of FIG. 2, it is possible to have an amplifier circuit of infrared sensor, which has smaller circuit scale, higher noise resistant property and better S/N and shorter time for warming up. An example of the arrangement in this case is shown in FIG. 8. FIG. 8 represents an example where the amplifier circuit shown by A in FIG. 7 is applied to the case of two passive infrared detectors $P_1$ and $P_2$. Each of the infrared detectors $P_1$ and $P_2$ has the arrangement shown by P in FIG. 7. Each of the capacitors $C_{20}$ and $C_{21}$ corresponds to the capacitor $C_{11}$ in FIG. 7. In FIG. 8, the same component as in FIG. 7 is referred by the same symbol.

In the arrangement shown in FIG. 8, switches $2_1$ and $2_2$ are alternately turned on and off at a predetermined cycle by a control unit 4 (not shown). In case the switch $2_1$ is turned on and closed, the capacitor $C_{20}$ and the resistance $R_{11}$ constitute HPF which determines low frequency side cutoff frequency $f_{CL}$ of band characteristics. In case the switch $2_2$ is turned on and closed, the capacitor $C_{21}$ and the resistance $R_{11}$ constitute HPF which determines low frequency side cutoff frequency $f_{CL}$ of band characteristics. Therefore, in normal case, $C_{20}=C_{21}$. The other operation is the same as explained in connection with FIG. 7.

In FIG. 8, if it is supposed that the switch $2_1$ is closed by a control signal from the control unit 4 and the switch $2_2$ is opened and that there is a person moving in the visual field of the passive infrared detector $P_1$, a certain voltage is outputted from the passive infrared detector $P_1$ and it is amplified by the amplifier circuit A and is inputted to the control unit 4. In this case, the capacitor $C_{13}$ is charged with electric charge, which corresponds to the output voltage of the operational amplifier 12.

From this condition, the switch $2_1$ is then opened by a control signal from the control unit 4 and the switch $2_2$ is closed. In this case, the electric charge in the capacitor $C_{13}$ is not completely discharged, and it is confirmed that electric charge remains to some extent. Consequently, in case the switch $2_2$ is closed and electric charge remains in the capacitor $C_{13}$ when the switch $2_1$ is closed, even when there is no person moving in the visual field of the passive infrared detector $P_2$, the voltage corresponding to the electric charge remaining in the capacitor $C_{13}$ is amplified by the operational amplifier 13. As a result, the output voltage $V_{OUT}$ exceeds the threshold value set in the control unit 4, and an alarm signal may be issued. In this case, it is judged that a person is moving, i.e. there is an intruder, even though there is no person moving in the visual field of the passive infrared detector $P_2$.

This type of phenomenon also occurs in case there is a person moving in the visual field of the passive infrared detector $P_2$ when the switch $2_1$ is opened and the switch $2_2$ is closed, and then, the switch $2_1$ is closed and the switch $2_2$ is opened. In this case, it is judged that there is an intruder even though there is no person moving in the visual field of the passive infrared detector $P_1$.

As described above, in the arrangement shown in FIG. 8, by the electric charge in the capacitor $C_{13}$, the output of the passive infrared detector $P_1$ exerts influence on the output of the passive infrared detector $P_2$, or the output of the passive infrared detector $P_2$ exerts influence on the output of the passive infrared detector $P_1$. This means that, by the electric charge in the capacitor $C_{13}$, the outputs of the passive infrared detectors $P_1$ and $P_2$ interfere with each other.

It is naturally not desirable that the outputs of the passive infrared detectors interfere with each other.

To solve the above problems, it is an object of the present invention to provide an amplifier circuit of an infrared sensor, which is used to amplify outputs from a plurality of passive infrared detectors in a single system of amplifier circuit by cyclically switching the outputs at a predetermined cycle and in which no interference of outputs occurs between the passive infrared detectors.

SUMMARY OF THE INVENTION

To attain the above object, the amplifier circuit for infrared sensor according to the present invention amplifies outputs from a plurality of passive infrared detectors in a single system of amplifier circuit by cyclically switching, whereby the amplifier circuit comprises a two-stage amplifier circuit comprising a primary stage amplifier and a second stage amplifier, there are provided between the primary stage amplifier and the second stage amplifier as many series circuits as the passive infrared detectors, the series circuits are aligned in parallel and comprise capacitors to determine cutoff frequency on low frequency side of band characteristics, switches to be switched over in synchronization with cyclic switching of outputs from the passive infrared detectors, and a bias voltage generating circuit for providing a predetermined bias voltage to the primary stage amplifier and the second stage amplifier.

DETAILED DESCRIPTION OF THE PREFERRED EMBODIMENT

In the following, description will be given on an embodiment of the present invention referring to the attached drawings.

Figure 1:
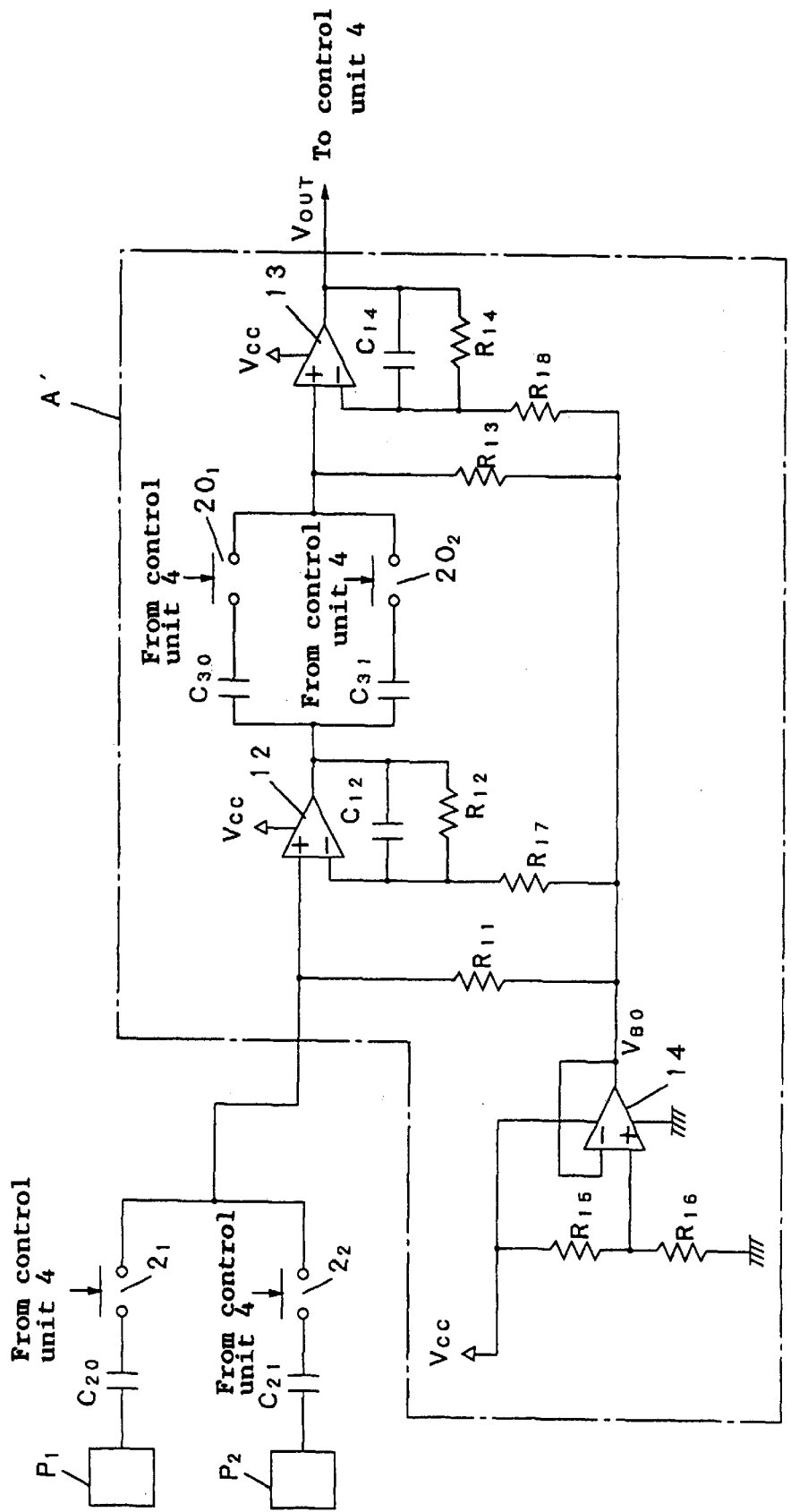
FIG. 1 is a circuit diagram of an embodiment of an amplifier circuit of a passive infrared detector according to the present invention.
Figure 2:
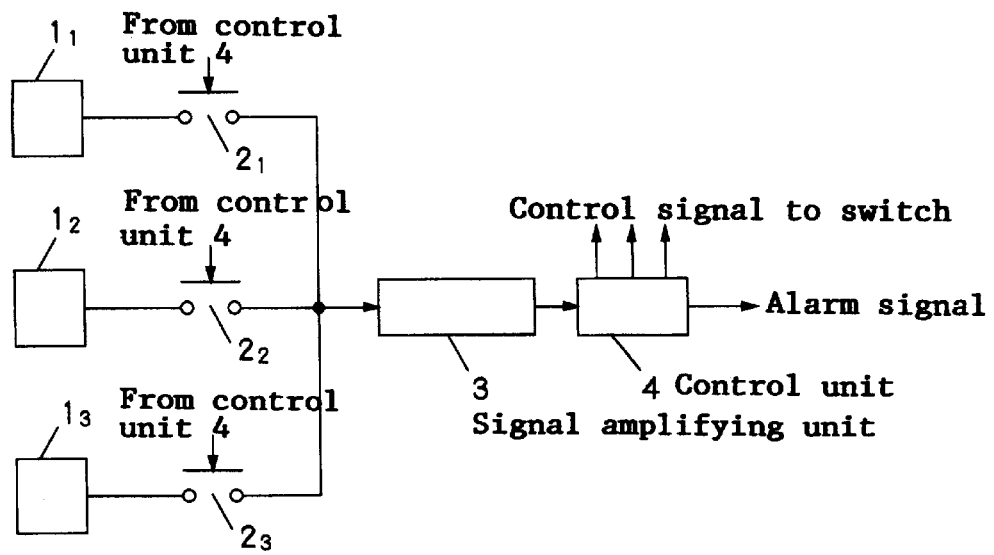
FIG. 2 is a block diagram showing an arrangement example in case a signal processing circuit as previously proposed by the present applicant is applied to an infrared sensor using three passive infrared detectors.
Figure 3:
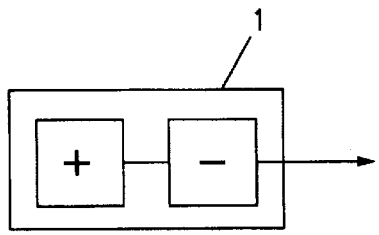
FIG. 3 is a drawing to represent a twin type infrared sensor element.
Figure 4:
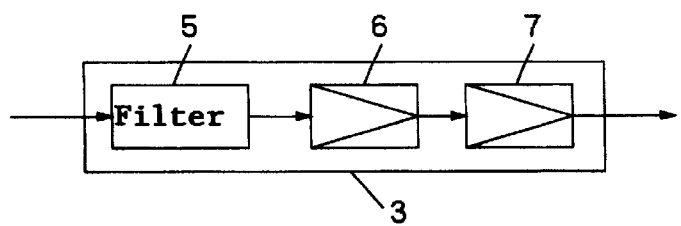
FIG. 4 is a drawing to show an arrangement example of a signal amplifying unit 3 in FIG. 2.
Figure 8:
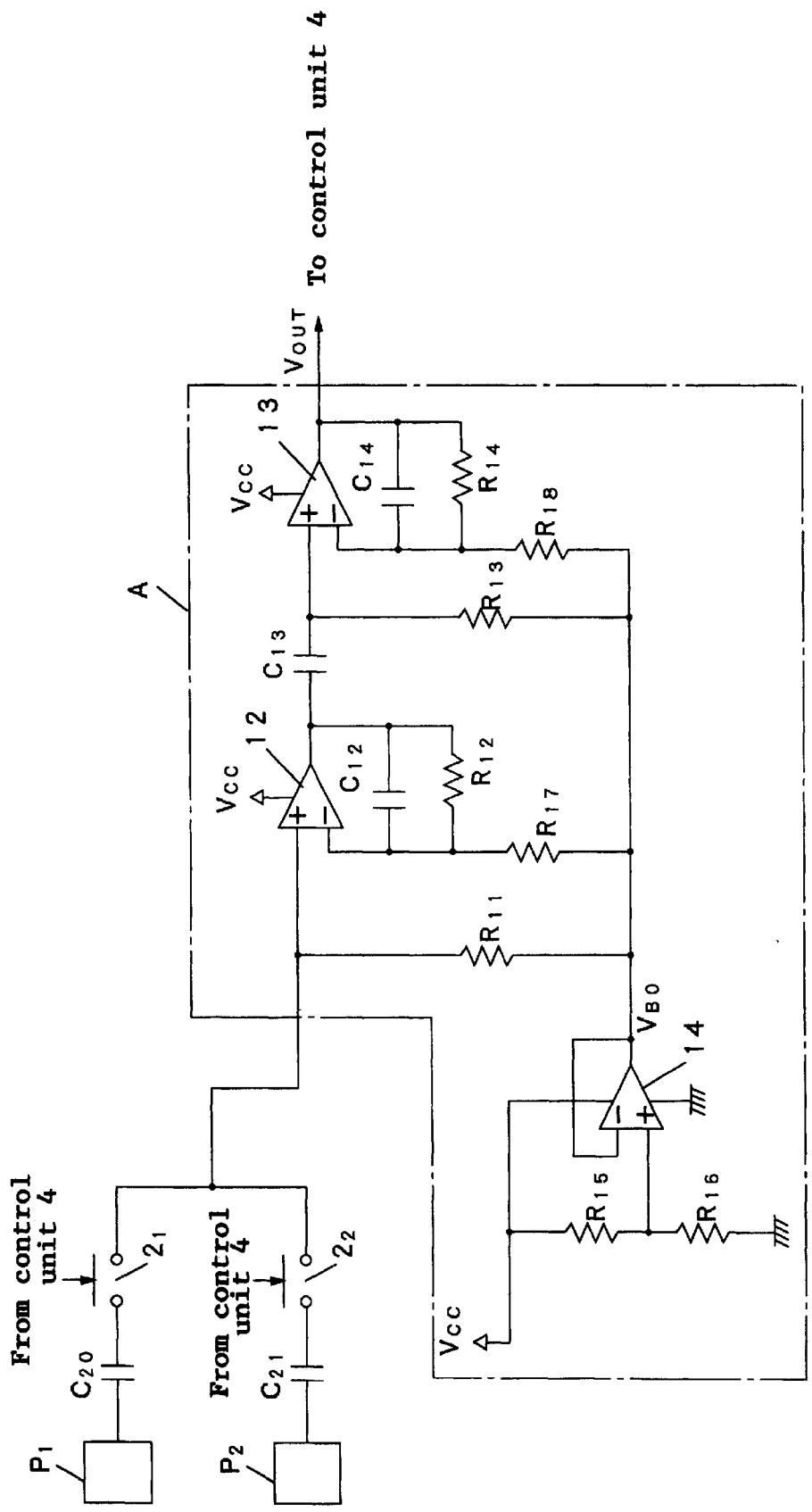
FIG. 8 is a diagram showing an arrangement example when the amplifier circuit shown by A in FIG. 7 is applied to a case where two passive infrared detectors $P_1$ and $P_2$ are used.

FIG. 1 is a diagram showing an embodiment of an amplifier circuit for an infrared sensor according to the present invention when the invention is applied to the case where two passive infrared detectors $P_1$ and $P_2$ are used. In FIG. 1, reference symbol A' represents an amplifier circuit of the present invention, and it corresponds to the signal amplifying unit 3 in FIG. 2. Also, reference symbols $20_1$ and $20_2$ each represents a switch and $C_{30}$ and $C_{31}$ each represents a capacitor. In FIG. 1, the same component as in FIG. 8 is referred by the same symbol. An output of an operational amplifier 13 is inputted to a control unit 4 as in the case of FIG. 2.

In the arrangement shown in FIG. 1, switches $2_1$ and $2_2$ are alternately turned on and off at a predetermined cycle by the control unit 4 (not shown). In case the switch $2_1$ is turned on and closed, a capacitor $C_{20}$ and a resistance $R_{11}$ constitute HPF which determines low frequency side cutoff frequency $f_{CL}$ in band characteristics. In case the switch $2_2$ is turned on and closed, a capacitor $C_{21}$ and the resistance $R_{11}$ constitute HPF which determines low frequency side cutoff frequency $f_{CL}$ in band characteristics. Therefore, in normal case, $C_{20}=C_{21}$.

Between an output terminal of an operational amplifier 12 and a non-inverting input terminal of an operational amplifier 13, series circuits of the capacitors and the switches are provided. The series circuits of the capacitors and the switches are provided in parallel as many as the infrared detectors. In FIG. 1, there are provided two passive infrared detectors, i.e. $P_1$ and $P_2$. Thus, two series circuits, i.e. a series circuit of the capacitor $C_{30}$ and the switch $20_1$ and a series circuit of the capacitor $C_{31}$ and the switch $20_2$, are aligned in parallel. The switches $20_1$ and $20_2$ match the switches $2_1$ and $2_2$ on one-to-one basis, and the matched switches are synchronized and opened or closed by the control unit 4. Here, it is supposed that the switch $20_1$ matches the switch $2_1$ and is opened or closed in synchronization with the latter, and that the switch $20_2$ matches the switch $2_2$ and is opened or closed in synchronization with the latter. Therefore, the switches $20_1$ and $20_2$ are synchronized with the switches $2_1$ and $2_2$ respectively and are opened or closed cyclically at a predetermined cycle.

Figure 7:
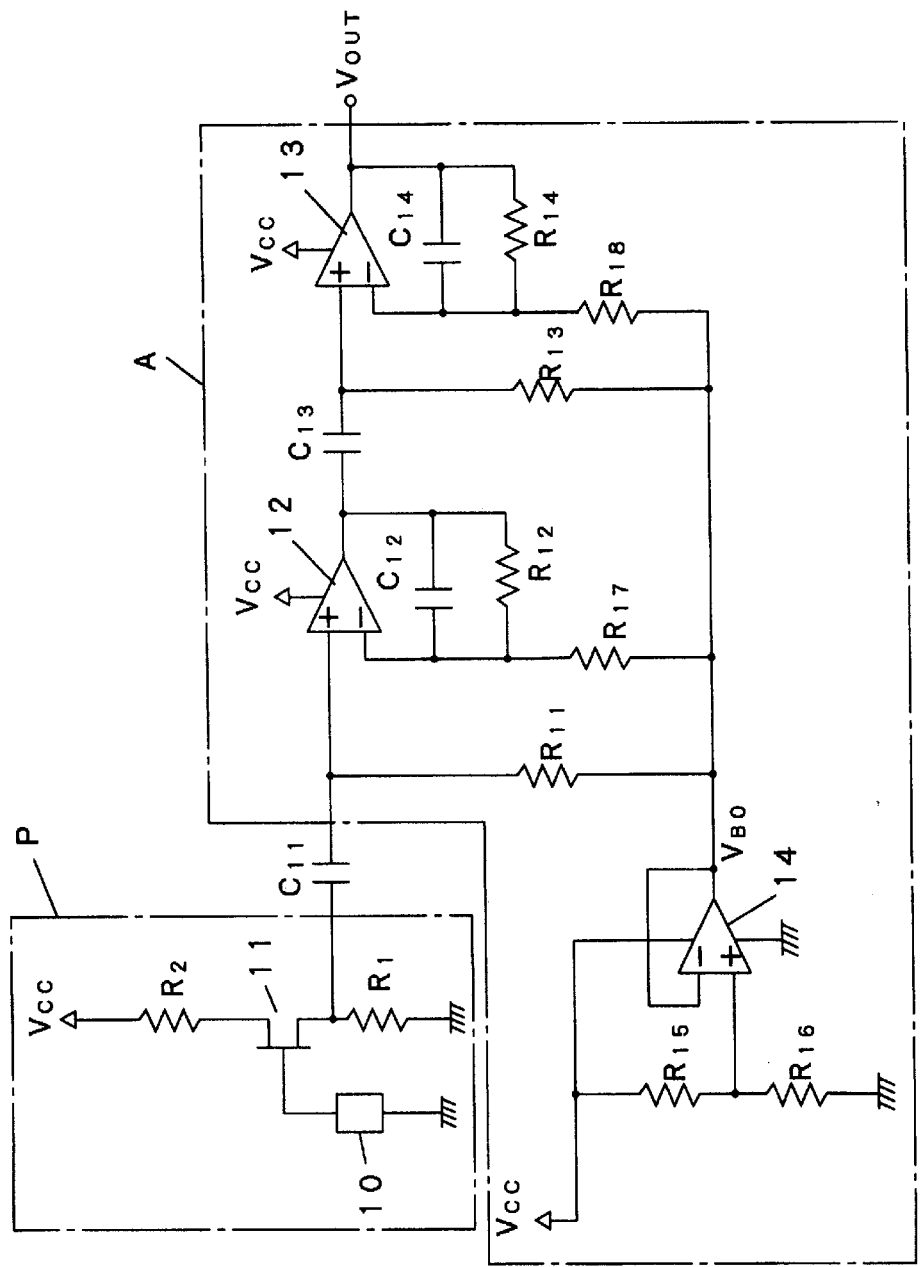
FIG. 7 is a diagram of an embodiment of an amplifier circuit of an infrared sensor previously proposed by the present applicant.

As it can be easily understood when an amplifier circuit A' in FIG. 1 is compared with an amplifier circuit A in FIG. 7, each of the capacitors $C_{30}$ and $C_{31}$ corresponds to the capacitor $C_{13}$ in FIG. 7. Therefore, when the switch $20_1$ is closed, the capacitor $C_{30}$ and the resistance $R_{13}$ constitute HPF. By the time constant of HPF, i.e. by $R_{13} \times C_{30}$, cutoff frequency on low frequency side of band characteristics is determined. Similarly, when the switch $20_2$ is closed, the capacitor $C_{31}$ and the resistance $R_{13}$ constitute HPF. By a time constant of HPF, i.e. by $R_{13} \times C_{31}$, cutoff frequency on low frequency side of band characteristics is determined. In normal case, $C_{30} = C_{31}$.

Operation is performed as follows:

When the switch $2_1$ is closed by a control signal from the control unit 4, the switch $20_1$ is also closed at the same time. An output from the passive infrared detector $P_1$ is inputted to a non-inverting input terminal of the operational amplifier 12, serving as a primary stage amplifier, via HPF which is constituted by the capacitor $C_{20}$ and the resistance $R_{11}$. The HPF constituted by the capacitor $C_{20}$ and the resistance $R_{11}$ is the one to determine cutoff frequency $f_{CL}$ on low frequency side of band characteristics as explained in connection with FIG. 8.

As described above, DC component of the output of the passive infrared detector $P_1$ is cut by the capacitor $C_{20}$. On the other end of the resistance $R_{11}$, a bias voltage $V_{BO}$ from a bias voltage generating circuit is applied. Thus, the signal inputted to the non-inverting input terminal of the operational amplifier 12, serving as a primary stage amplifier, is amplified with the bias voltage $V_{BO}$ as the central voltage.

Amplification factor of the operational amplifier 12 is determined by $R_{12}/R_{17}$. Also, the resistance $R_{12}$ and the capacitor $C_{12}$ constitute a filter to determine cutoff frequency $f_{CH}$ on high frequency side of band characteristics, and the high frequency side cutoff frequency $f_{CH}$ is determined by a time constant $R_{12} \times C_{12}$.

As described above, in the primary stage amplifier of the operational amplifier 12, amplification is performed by a factor of $R_{12}/R_{17}$ with the bias voltage $V_{BO}$ as the central voltage, and the band characteristics are limited to $f_{CL}$–$f_{CH}$.

An output signal of the operational amplifier 12 is inputted to the non-inverting input terminal of the operational amplifier 13, serving as a second stage amplifier, via HPF, which is constituted by the capacitor $C_{30}$ and the resistance $R_{13}$. As described above, the HPF constituted by the capacitor $C_{30}$ and the resistance $R_{13}$ determines cutoff frequency $f_{CL}$ on low frequency side of band characteristics, and the low frequency side cutoff frequency $f_{CL}$ is determined by a time constant $R_{13} \times C_{30}$. Here, $R_{11} \times C_{20} = R_{13} \times C_{30}$.

Thus, DC component of the output signal of the operational amplifier 12 is cut by the capacitor $C_{30}$. On the other end of the resistance $R_{13}$, a bias voltage $V_{BO}$ from a bias voltage generating circuit is applied, and a signal to be inputted to the non-inverting input terminal of the operational amplifier 13, serving as a second stage amplifier, is amplified with the bias voltage $V_{BO}$ as the central voltage. Amplification factor of the operational amplifier 13 is determined by $R_{14}/R_{18}$. Also, the resistance $R_{14}$ and the capacitor $C_{14}$ constitute cutoff frequency $f_{CH}$ on high frequency side of band characteristics, and the high frequency side cutoff frequency $f_{CH}$ is determined by a time constant $R_{14} \times C_{14}$. Here, $R_{12} \times C_{12} = R_{14} \times C_{14}$.

Accordingly, at the second stage amplifier, amplification is performed by a factor of $R_{14}/R_{18}$ with the bias voltage $V_{BO}$ as the central voltage, and the band characteristics are limited to $f_{CL}$–$f_{CH}$. An output signal $V_{OUT}$ of the operational amplifier 13 is inputted to the control unit 4.

Figure 5:
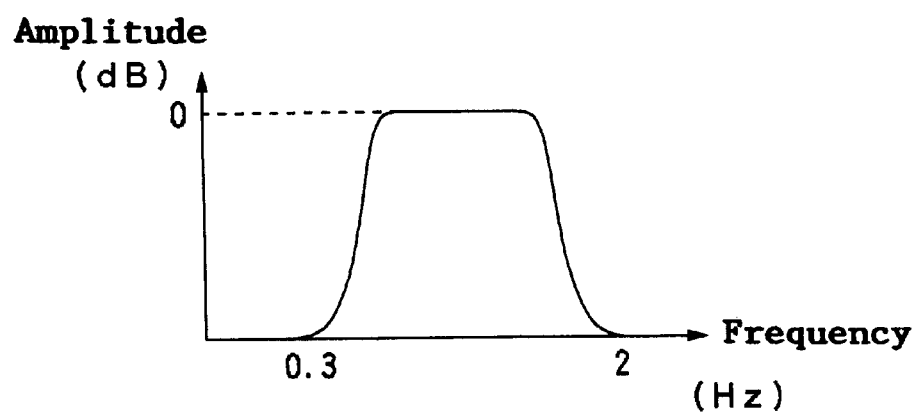
FIG. 5 is a diagram showing an example of frequency characteristics of a filter 5 in FIG. 4.
Figure 6:
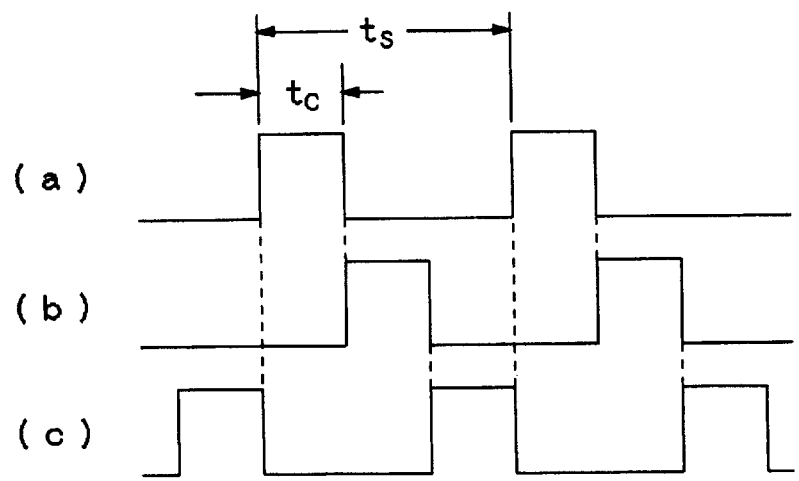
FIG. 6 is a drawing to explain an aspect of opening/closing control of switches $2_1$ to $2_3$ in FIG. 2.

Therefore, by setting the cutoff frequency on low frequency side of band characteristics to about 0.3 Hz and the cutoff frequency on high frequency side of band characteristics to about 2 Hz, it is possible to constitute an amplifier circuit which has the band characteristics as shown in FIG. 5.

Next, when the switch $2_2$ is closed by a control signal from the control unit 4, the switch $20_2$ is also closed at the same time. An output from the passive infrared detector $P_2$ is inputted to the non-inverting input terminal of the operational amplifier 12, serving as a primary stage amplifier, via HPF which is constituted by the capacitor $C_{21}$ and the resistance $R_{11}$. As explained in connection with FIG. 8, the HPF constituted by the capacitor $C_{21}$ and the resistance $R_{11}$ determines the cutoff frequency $f_{CL}$ on low frequency side of band characteristics.

Accordingly, DC component of the output of the passive infrared detector $P_2$ is cut by the capacitor $C_{21}$. On the other end of the resistance $R_{11}$, a bias voltage $V_{BO}$ from a bias voltage generating circuit is applied, and the signal to be inputted to the non-inverting input terminal of the operational amplifier 12, serving as the primary stage amplifier, is amplified with the bias voltage $V_{BO}$ as the central voltage. As described above, therefore, in the primary stage amplifier of the operational amplifier 12, amplification is performed by a factor of $R_{12}/R_{17}$ with the bias voltage $V_{BO}$ as the central voltage, and the band characteristics are limited to $f_{CL}$–$f_{CH}$.

The output signal of the operational amplifier 12 is inputted to the non-inverting input terminal of the operational amplifier 13, serving as a second stage amplifier, via HPF which is constituted by the capacitor $C_{31}$ and the resistance $R_{13}$. As described above, the HPF constituted by the capacitor $C_{31}$ and the resistance $R_{13}$ determines the cutoff frequency $f_{CL}$ on low frequency side of band characteristics, and the low frequency side cutoff frequency $f_{CL}$ is determined by a time constant $R_{13} \times C_{31}$. Here, $R_{11} \times C_{21} = R_{13} \times C_{31}$.

Thus, DC component of the output signal of the operational amplifier 12 is cut by the capacitor $C_{31}$. On the other end of the resistance $R_{13}$, a bias voltage $V_{BO}$ from a bias voltage generating circuit is applied, and a signal inputted to the non-inverting input terminal of the operational amplifier, serving as a second stage amplifier, is amplified with the bias voltage $V_{BO}$ as the central voltage. Therefore, in the second stage amplifier, the signal is amplified by a factor of $R_{14}/R_{18}$ with the bias voltage $V_{BO}$ as the central voltage, and the band characteristics are limited to $f_{CL}$–$f_{CH}$. The output signal $V_{OUT}$ of the operational amplifier 13 is inputted to the control unit 4.

Therefore, by setting the cutoff frequency on low frequency side of band characteristics to about 0.3 Hz and the cutoff frequency on high frequency side of band characteristics to about 2 Hz, it is possible to constitute an amplifier circuit which has the band characteristics as shown in FIG. 5.

As described above, according to the arrangement shown in FIG. 1, when an output from the passive infrared detector $P_1$ is amplified, the capacitor $C_{30}$ is used and the capacitor $C_{31}$ is not used. As a result, even when the capacitor $C_{31}$ is charged with some electric charge in case the switches $2_1$ and $20_1$ are closed, no action is exerted when the output from the passive infrared detector $P_1$ is amplified by electric charge in the capacitor $C_{31}$. On the contrary, when the output from the passive infrared detector $P_2$ is amplified, the capacitor $C_{31}$ is used, and the capacitor $C_{30}$ is not used. As a result, even when the capacitor $C_{30}$ is charged with some electric charge in case the switches $2_2$ and $20_2$ are closed, the electric charge in the capacitor $C_{30}$ exerts no action when the output from the passive infrared detector $P_2$ is amplified. This makes it possible to avoid the situation where outputs of the passive infrared detectors $P_1$ and $P_2$ provided by the arrangement shown in FIG. 8 interfere with each other.

In the above, description has been given on an embodiment of the present invention, while it is needless to say that the present invention is not limited to the above embodiment, and various changes and modifications can be made without departing from the spirit and the scope of the present invention. For example, two passive infrared detectors are used in the above embodiment, while three or more passive infrared detectors may be used.

What is claimed is:

1. An amplifier circuit for an infrared sensor for amplifying outputs from a plurality of passive infrared detectors in a single system of an amplifier circuit by cyclically switching, said amplifier circuit including a two-stage amplifier circuit comprising:

a primary stage amplifier;

a second stage amplifier;

a plurality of series circuits provided between said primary stage amplifier and said second stage amplifier, there being the same number of said series circuits as the number of said passive infrared detectors; and a bias voltage generating circuit for providing a predetermined bias voltage to said primary stage amplifier and said second stage amplifier, wherein said series are connected in parallel and each said series circuit comprises at least one capacitor to determine a low frequency cut off and at least one switch to be switched over in synchronization with cyclic switching of outputs from said passive infrared detectors.

* * * * *